(12) United States Patent
Chow et al.

(10) Patent No.: US 9,564,901 B1
(45) Date of Patent: Feb. 7, 2017

(54) SELF-TIMED DYNAMIC LEVEL SHIFTER WITH FALLING EDGE GENERATOR

(71) Applicant: Apple Inc., Cupertino, CA (US)

(72) Inventors: Daniel C. Chow, Austin, TX (US); Kenneth W. Jones, Austin, TX (US); William R. Weier, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/972,754

(22) Filed: Dec. 17, 2015

(51) Int. Cl.
*H03K 19/0185* (2006.01)
*H03K 3/356* (2006.01)
*H03K 5/156* (2006.01)

(52) U.S. Cl.
CPC ........ *H03K 19/01855* (2013.01); *H03K 3/356* (2013.01); *H03K 5/1565* (2013.01)

(58) Field of Classification Search
CPC . H03K 19/01855; H03K 3/356; H03K 5/1565
USPC ........................................................ 327/231
See application file for complete search history.

(56) References Cited

U.S. PATENT DOCUMENTS

| | | | | |
|---|---|---|---|---|
| 6,366,127 B1* | 4/2002 | Friedman | ....... | H03K 19/018521 326/56 |
| 7,782,093 B2* | 8/2010 | Dray | ........ | G11C 7/22 327/24 |
| 7,839,195 B1 | 11/2010 | Feng et al. | | |
| 8,493,125 B2* | 7/2013 | Kikuchi | ......... | H03K 19/018521 326/80 |
| 8,638,153 B2 | 1/2014 | Ge et al. | | |
| 9,154,117 B2* | 10/2015 | Jung | ................ | H03K 3/356104 |
| 2006/0273838 A1 | 12/2006 | Berthold et al. | | |
| 2007/0279092 A1* | 12/2007 | Wood | ............. | H03K 19/018521 326/81 |
| 2011/0140750 A1* | 6/2011 | Kojima | ............ | H03K 3/356165 327/198 |

* cited by examiner

*Primary Examiner* — Ryan Jager
(74) *Attorney, Agent, or Firm* — Meyertons, Hood, Kivlin, Kowert & Goetzel, P.C.; Erik A. Heter

(57) ABSTRACT

A clock circuit configured to generate a falling edge independently of an input clock signal is disclosed. In one embodiment, a clock circuit includes an input circuit coupled to receive an input clock signal. A corresponding first clock signal is provided on a first clock node, while a second clock signal that is a delayed version of the first is provided on a second clock signal. The clock circuit may generate an output clock signal based on the first and second clock signals and a feedback signal received from a functional circuit coupled to receive the output clock signal. The rising edge of the output clock signal is generated dependent upon when the rising edge of the input clock signal is received. The falling edge of the output clock signal is generated by the clock circuit independently of when the falling edge of the input clock signal is received.

20 Claims, 5 Drawing Sheets

SELF-TIMED DYNAMIC LEVEL SHIFTER WITH FALLING EDGE GENERATOR

BACKGROUND

Technical Field

This disclosure is directed to electronic circuits, and more particularly, to circuits that perform level shifting and clock generation functions.

Description of the Related Art

Integrated circuits utilizing digital logic may include a number of circuits whose operation is synchronized to a clock signal. The types of circuits that operate according to a clock signal include flip-flops, various types of memory, counters, and so on.

As integrated circuits have become denser, clock signals have become faster (i.e., higher frequency). Furthermore, sequential circuits typically have timing budgets, which is an allotted amount of time in which to complete operations when a received clock signal is in a certain state. Furthermore, many clock signals operate according to a duty cycle, which is the amount of time within a single clock cycle that the clock signal is considered to be active (e.g., high) relative to the amount of time a clock signal is inactive (e.g., low). For example, a clock signal having a 50% duty cycle may spend half a cycle high and half a cycle low. Sequential circuits may be designed such that a single cycle's worth of operations are performed during the portion of a clock cycle that is active.

SUMMARY

A clock circuit configured to generate a falling edge independently of an input clock signal is disclosed. In one embodiment, a clock circuit includes an input circuit coupled to receive an input clock signal. A corresponding first clock signal is provided on a first clock node, while a second clock signal that is a delayed version of the first is provided on a second clock signal. The clock circuit may generate an output clock signal based on the first and second clock signals and a feedback signal received from a functional circuit coupled to receive the output clock signal. The rising edge of the output clock signal is generated dependent upon when the rising edge of the input clock signal is received. The falling edge of the output clock signal is generated by the clock circuit independently of when the falling edge of the input clock signal is received.

By generating the falling edge of the output clock signal independent of the falling edge of the input clock signal, the clock generation circuit may operating independently of the duty cycle of the latter. Thus, timing requirements for the functional circuitry that receives the output clock signal need not be tailored to the duty cycle of the input clock signal. Instead, a delay circuit implemented in the circuitry configured to receive the output clock signal may provide a sufficient delay to allow the functional circuitry to perform its work before the output clock signal falls low (or more generally, to the inactive portion of its cycle). Thus, even if the duty cycle of the input signal is not sufficient to allow the functional circuitry to perform its work for a given cycle, the clock circuit disclosed herein may nevertheless provide sufficient time.

In additional to performing the functions described above, the clock circuit may also perform level shifting and clock gating functions. As a level shifter, the input clock signal may be received from a first voltage domain having circuitry operating according to a first supply voltage. The output clock signal may be provided to circuitry in a second voltage domain operating according to a second supply voltage that is different from the first.

The clock circuit may also operate as a clock gating circuit. In particular, the clock circuit may include an enable circuit configured to receive an external enable signal. The clock circuit may generate the output clock signal when the enable signal is active. When the enable signal is inactive, the clock circuit may be inhibited from generating the output clock signal. Accordingly, if the functional circuitry receiving the output clock signal is not performing useful work, it may be placed in a clock-gated state in order to save power.

BRIEF DESCRIPTION OF THE DRAWINGS

The following detailed description makes reference to the accompanying drawings, which are now briefly described.

Figure 1:
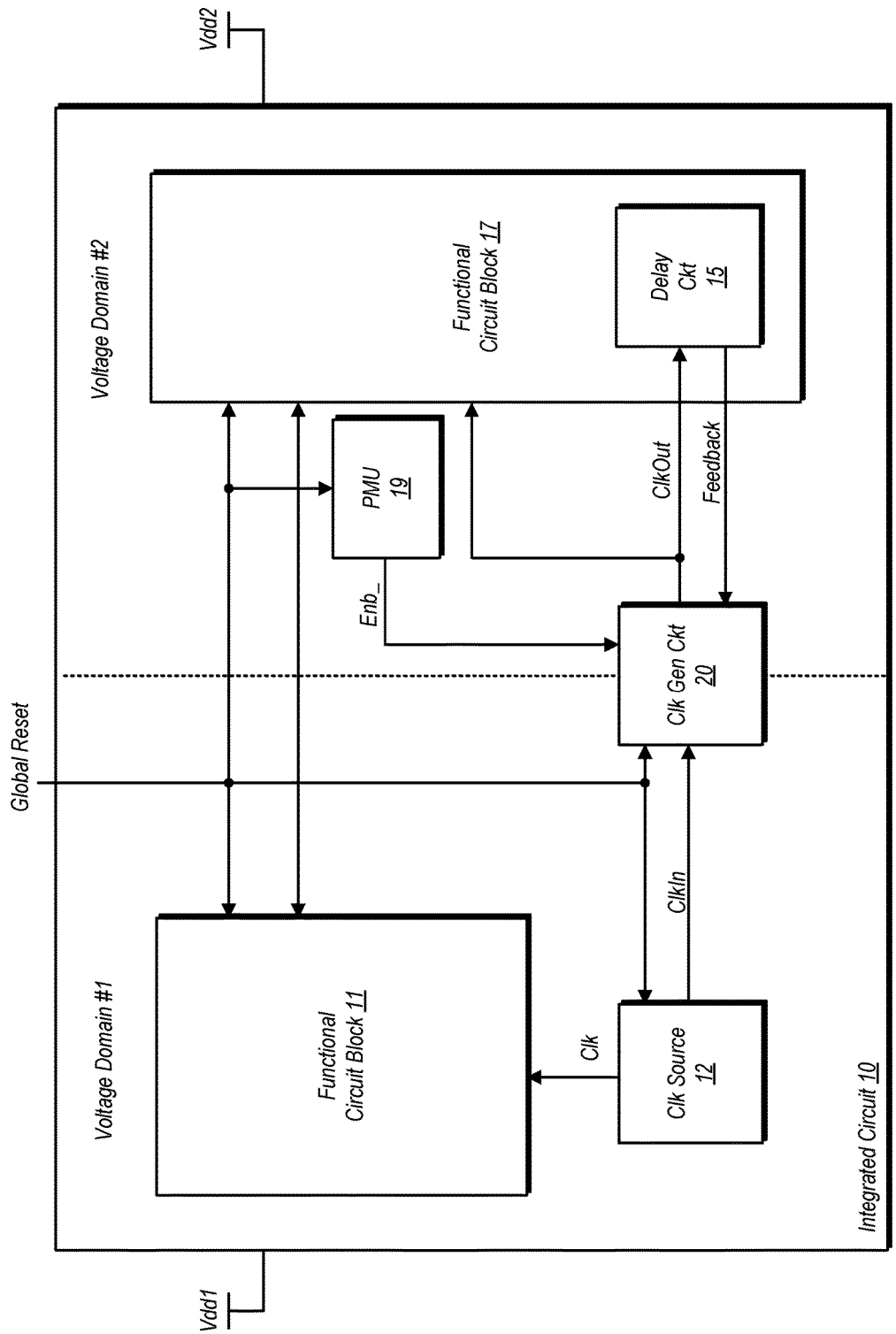
FIG. 1 is a block diagram of one embodiment of an integrated circuit.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) (or pre-AIA paragraph six) interpretation for that unit/circuit/component.

DETAILED DESCRIPTION OF EMBODIMENTS

Turning now to FIG. 1, a block diagram of one embodiment of an integrated circuit (IC) is shown. As shown here, integrated circuit 10 is an exemplary embodiment provided for illustrative purposes. However, it is not intended to limit the scope of this disclosure.

In the embodiment shown, IC 10 includes two voltage domains, voltage domain #1 and voltage domain #2. A first functional circuit block 11 is located in voltage domain #1, while a second functional circuit block 17 is located in voltage domain #2. The two functional circuit blocks are coupled to communicate with one another. The functional circuit blocks may perform various functions. For example, in one embodiment, functional circuit block 11 may be a processing circuit, while functional circuit block 17 may be an internal memory. In general, the functional circuit blocks 11 and 17 may be virtually any type of circuitry, and are thus not limited to the examples given here.

A clock source 12 is implemented in voltage domain #1. This clock source provides a clock signal, Clk, to synchronize operation of the circuits in functional circuit block 11. Additionally, clock source 12 provide a clock signal, ClkIn, to a clock generation circuit 20. In some embodiments, Clk and ClkIn may be the same clock signal.

Clock generation circuit 20 in the embodiment shown provides a number of functions. These functions include generation of the output clock signal, ClkOut, a level shifting function, and a clock gating function. The output clock signal may be generated in part independently of the duty cycle of the input clock signal, ClkIn. In particular, the rising edge of ClkOut in this embodiment is generated responsive to receiving a rising edge of ClkIn. However, the falling edge of ClkOut is generated independent of when the falling edge of ClkIn is received. Accordingly, operation of functional circuit block 17 need not be limited by timing requirements that would otherwise be imposed by the duty cycle of ClkIn. Instead of using the falling edge of ClkIn, the falling edge of ClkOut is generated based on a delay provided by delay circuit 15, which is implemented in functional circuit block 17. The timing of the delay circuit may be set based on the amount of time needed for functional circuit block 17 (or particular circuits therein) to complete their work for a given clock cycle. For example, consider an embodiment in which functional circuit block 17 is an internal memory. The amount of delay provided by delay circuit 15 may be such that the memory is allowed to generate signals on word lines, activate sense amplifiers, and output data to be ready for reading by another functional circuit block (e.g., functional circuit block 11). This delay may be set irrespective of the duty cycle of ClkIn.

It is noted that delay circuit 15 need not be a traditional delay circuit having delay elements (e.g., a number of serially coupled inverters). The delay circuit 15 may be implemented as virtually any type of circuitry that provides some delay between input and output. Moreover, the delay circuit 15 may be a circuit that responds to the rising edge of ClkOut and sometime thereafter produces at least one output signal that can be utilized as the feedback signal provided back to clock generation circuit 20.

Since clock generation circuit 20 is implemented between the two voltage domains, it thus provides a level shifting function. The ClkIn signal is received by clock generation circuit from voltage domain #1, operating according to a first supply voltage, Vdd1. The ClkOut signal is provided by clock generation circuit 20 into voltage domain #2, which operates according to the second supply voltage, Vdd2. Since these supply voltages may be different from one another, a level shifting function is implemented.

Clock generation circuit 20 may also provide a clock gating function. In this embodiment, a power management unit (PMU) 19 is implemented in voltage domain #2 (although it may be in a different power domain in other embodiments). PMU 19 may assert an enable signal, Enb (which is active low in this embodiment and labeled Enb_), that allows clock generation circuit 20 to generate ClkOut. However, when the Enb signal is not active, clock generation circuit 20 may be inhibited from providing the output clock signal.

Figure 2:
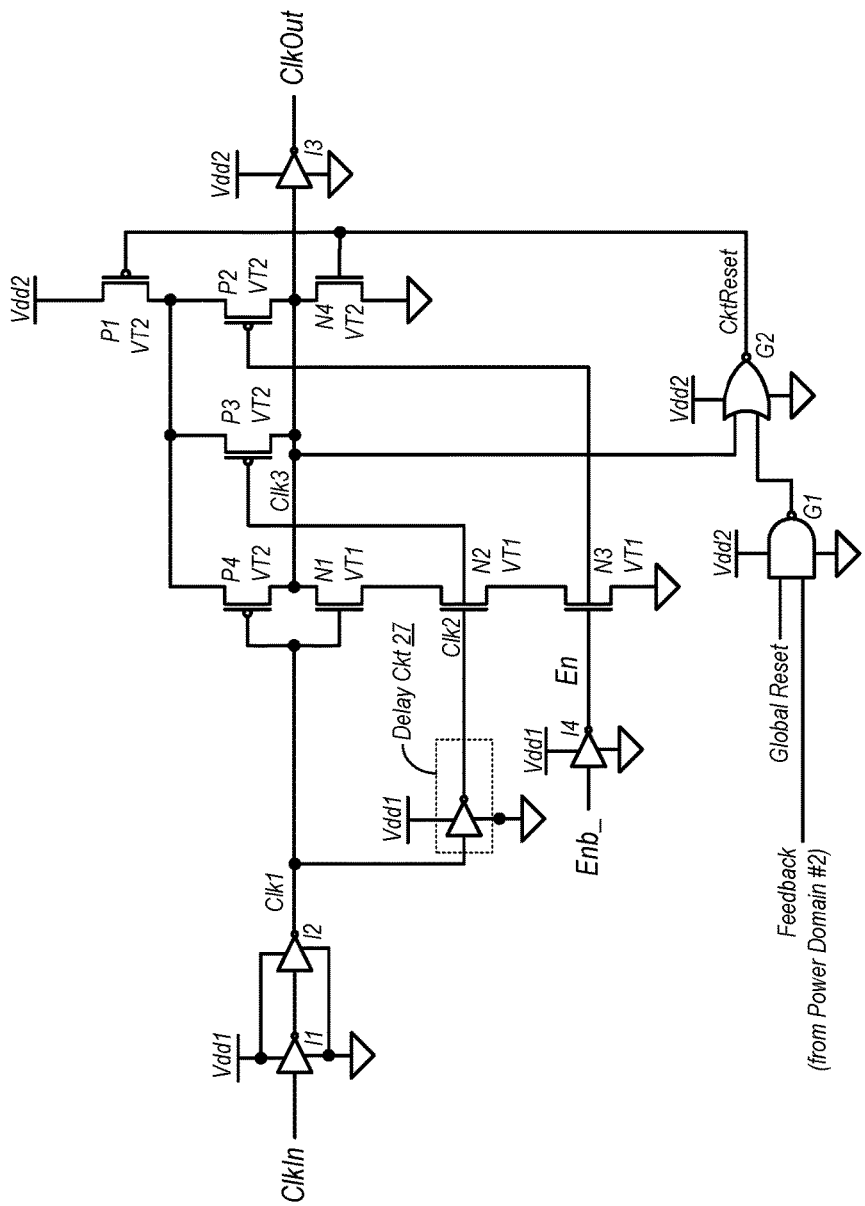
FIG. 2 is a schematic diagram of one embodiment of a clock generation circuit including level shifting and clock gating functionality.

FIG. 2 is a schematic diagram of one embodiment of clock generation circuit 20. Other embodiments are possible and contemplated. The circuit shown in FIG. 2 combines the functions of clock generation, clock gating, and level shifting. Circuits that receive power from supply voltage Vdd1 are considered to be in a first voltage domain, while circuits that receive power from Vdd2 are considered to be in a second voltage domain. It is further noted that some of the transistors shown herein switch based on a threshold voltage VT1, while others switch on a threshold voltage VT2. These transistors are marked in the drawing. The different threshold voltages are implemented in providing the level shifting function.

Clock generation circuit 20 includes an input circuit, inverters I1 and I2, configured to receive the input clock signal, ClkIn, and output a first clock signal, Clk1. Both of inverters I1 and I2 are in a first voltage domain, and are configured to receive supply voltage Vdd1. Clk1 is provided to the input of delay circuit 27, which includes an odd number inverters (one in this particular embodiment), which are also in the first voltage domain. The output of delay circuit 27 is a second clock signal, Clk2, which is a delayed complement of Clk1.

Clock generation circuit 20 includes a pull-down circuit that includes NMOS transistors N1, N2, and N3. The active low enable signal in the embodiment shown, Enb_, is provided from the first voltage domain through inverter I4. The output of I4 is the internal enable signal, En. When En is high, N3 may be activated. Upon receiving the rising edge of the input clock signal, the high on Clk1 may activate transistor N1. The output of delay circuit 27, Clk2, is high prior to the rising edge of Clk1, and remains so for a time equivalent to the delay provided thereby. Thus, N2 is active. With N1, N2, and N3 active, a node for a third clock signal, Clk3 is pulled low. With Clk3 pulled low, the output of inverter I3, ClkOut, transitions high. Inverter I3 is in the second voltage domain and thus receives the supply voltage Vdd2. Accordingly, ClkOut is output into the second voltage domain.

Both the global reset and feedback signals provided as inputs to NAND gate G1 are active low. During normal operation, the global reset signal remains high. The feedback signal will also be high at the time just prior to Clk1 rising and Clk3 being pulled low. Accordingly, G1 outputs a logic zero to one input of NOR gate G2. When Clk3 is pulled low, NOR gate G2 outputs a logic high on the CktReset node. This in turn activates transistor N4, which operated to maintain Clk3 low (and thus, ClkOut high) until a feedback signal is received. Moreover, transistor N4 provides the only pull-down path for Clk3 after Clk2 falls low, which occurs at the delay time of delay circuit 27 following Clk1 going high. When Clk2 falls low, N2 is deactivated, and thus the pull-down circuit of N1, N2, and N3 no longer provides a pull-down path. It is noted that when Clk2 falls low, transistor P3 may be activated. However, no pull-up path is provides at the time it initially receives a low on its gate due to the high on the CktReset node, which holds P1 inactive.

When the feedback signal become active (i.e. falls low in this embodiment), NAND gate G1 outputs a logic high to one of the inputs of NOR gate G2. This in turn causes G2 to output a low on the CktReset node, which deactivates N4 and activates P1. When P1 is initially activated, a pull-up path exists between Clk3 and Vdd2 through either P3 or P4, and P1. This in turn generates a falling edge to ClkOut. It is noted that ClkOut will fall low irrespective of the state of Clk1, which mirrors the state of the input clock signal, ClkIn. If Clk1 falls low prior to the activation of the feedback signal, transistor N4 may nevertheless maintain a low on Clk3 (and therefor a high on ClkOut) due to the high on the CktReset node. If, on the other hand, Clk1 is still high when the feedback signal is activated, the activation of P1 and P3 will provide a pull-up path between Clk3 and Vdd, while the deactivation of N2 cuts off the pull-down path for Clk3, thereby elimination possible contention issues. Thus, the circuit arrangement shown herein allows the generation of a falling edge of the output clock signal is independent of the time at which the falling edge of the input clock signal is received. As such, the timing circuitry that operates using the output clock signal need not be constrained by the duty cycle of the input clock signal.

As shown in FIG. 2, NAND gate G1 is coupled to receive a global reset signal. This signal is active low, and may be asserted when performing a reset of the IC in which clock generation circuit is implemented. Asserting the global reset signal forces NAND gate G1 to output a logic high. As a result, NOR gate G2 outputs a low to the gate of P1, thereby activating that device. The input enable signal, Enb_ can then be forced high, resulting in a low on the En node, and thus the activation of P3. Thus, a pull-up path is provided between Clk3 and Vdd2, forcing ClkOut low.

Figure 3:
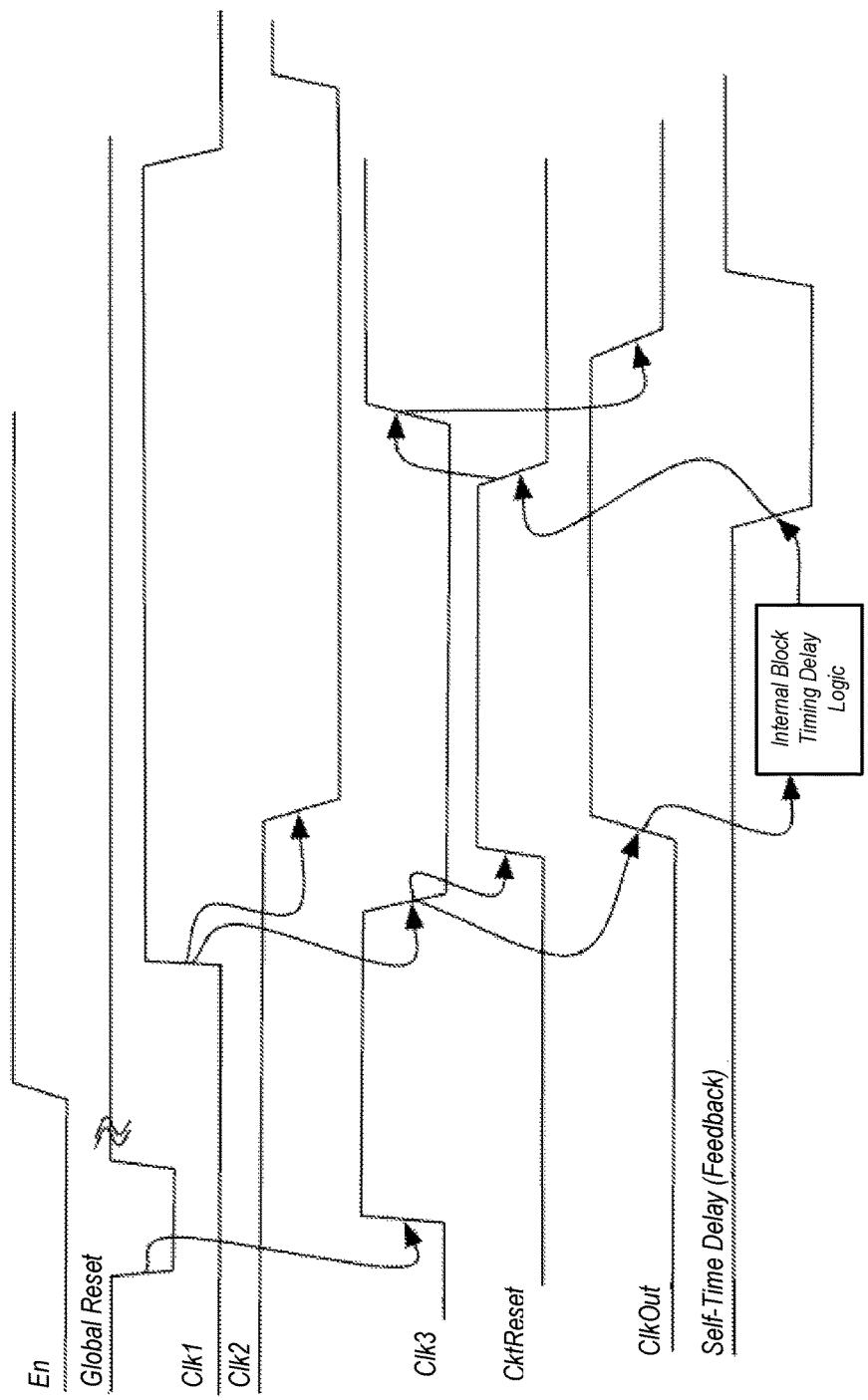
FIG. 3 is a timing diagram illustrating operation of one embodiment of a clock generation circuit.

FIG. 3 is a timing diagram illustrating the operation of one embodiment of a clock generation circuit. While FIG. 3 is directed toward the embodiment of clock generation circuit 20 shown in FIG. 2, it is noted that other embodiments of the circuit, and thus other exemplary timing diagrams, are possible and contemplated. In general, the principle of being able to generate a falling edge of the output clock signal independent of the timing of a falling edge of the input clock signal will apply.

Operation in the illustrated example begins with asserting the active low global reset signal and forcing the internal enable signal, En low. This forces CktReset low, which in turn results Clk3 being pulled high. As a result of pulling Clk3 high, the output clock signal, ClkOut, is held low. Thereafter, the circuit is enabled, and En transitions high.

Upon receiving a rising edge of the input clock signal, Clk1 transitions high. This activates a pull-down path and results in Clk3 being pulled low. When Clk3 is pulled low, ClkOut transitions high. Furthermore, the high on Clk1 is also propagated into the delay circuit coupled to that node, which results in Clk2 falling low after a delay time. Also, when Clk3 falls low, the CktReset now transitions high, guaranteeing the pull-down path is initially maintained after Clk2 falls low.

The rising edge of ClkOut results in a rising edge being input into internal block timing delay logic of the functional circuit receiving the output clock signal. This block of circuitry may be a simple delay circuit having a number of serially coupled delay elements, or may be another type of circuit. Generally speaking, any circuitry providing sufficient delay to allow the functional circuit block to complete a cycle's worth of work and provide consistent output signal when done can be used for the internal block timing delay logic. The timing may also be set so that the feedback signal falls low with sufficient time to allow other circuitry within clock generation circuit 20 to meet setup and hold time requirements for the next rising edge of the input clock signal. In this particular embodiment, the internal block timing delay logic will consistently output a logic low at a delay time after it receives the rising edge of the output clock signal.

When the feedback signal output by the internal block timing delay logic falls low, the CktReset signal also falls low as a result. This in turn causes Clk3 to be pulled high, thereby generating the falling edge of the output clock signal, ClkOut. At this point of operation, the circuit is reset and becomes ready to receive the next rising edge of the input clock signal.

It is noted that in this example, the falling edge of the output clock signal occurs prior to the falling edge of Clk1 (which is directly responsive to the input clock signal). This is one illustration of the independence of the falling edge of the output clock signal relative to the falling edge of the input clock signal. Depending on the timing of the internal block timing delay logic used, the falling edge of the output clock signal may occur before or after the falling edge of the input clock signal. The ability to set the timing of the falling edge of the output clock signal independent of that of the input clock signal may allow some flexibility in the design of the functional circuitry that operates according to the former. For example, timing requirements for functional circuitry that operates according to the output clock cycle may be determined independent of the duty cycle of for single cycles of the input clock signal.

Figure 4:
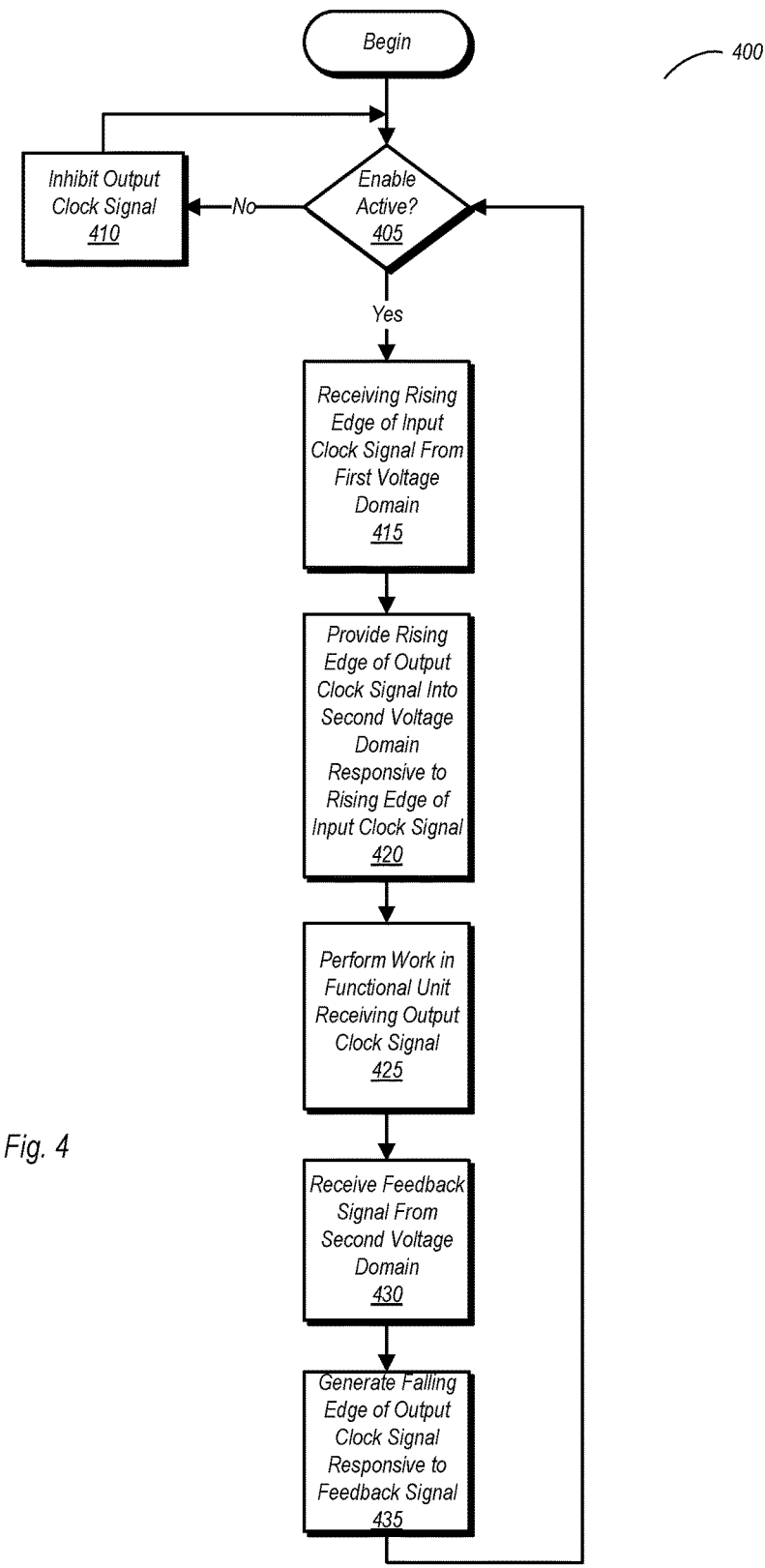
FIG. 4 is a flow diagram illustrating one embodiment of a method for operating a clock generation circuit.

FIG. 4 is a flow diagram of one embodiment of a method for operating a clock generation circuit. Method 400 may be implemented by clock generation circuit 20 as discussed above, but may also be implemented by any other clock generation circuit that provides level shifting and clock gating functions combined with the generation of a falling edge of the output clock signal independent of the falling edge of the input clock signal.

Method 400 begins with a determination of the state of the enable signal at some point in time subsequent to a global reset (block 405). If the enable signal is inactive (block 405, no), then the output clock signal is inhibited (block 410). If the enable signal is active (block 405, yes), then the output clock signal may be allowed to propagate. The circuit may then receive a rising edge of the input clock signal from a first voltage domain (block 415), a rising edge of an output clock signal may be provided responsive thereto into a second voltage domain (block 420). Responsive to receiving the rising edge of the output clock signal, a functional circuit block operating according thereto may perform its work (block 425). After allowing sufficient time for the functional circuit block to complete its work, a feedback signal is provided, from the second voltage domain (block 430). Responsive to receiving the feedback signal, a falling edge of the output clock signal is generated (block 435). This generation of the output clock signal falling edge occurs independent of when the falling edge of the input clock signal is received within a given cycle. Accordingly, operation of the clock generation circuit within a given cycle is independent of the duty cycle of the input clock signal.

Figure 5:
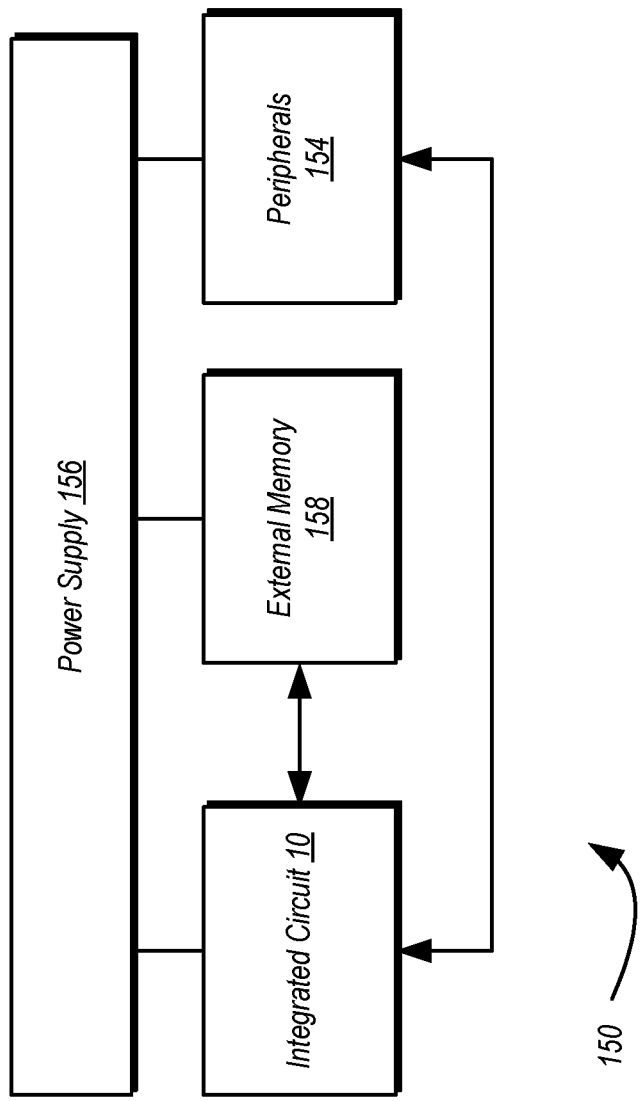
FIG. 5 is a block diagram of one embodiment of an exemplary system.

Turning next to FIG. 5, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
   a clock input circuit configured to receive an input clock signal, wherein the clock input circuit is configured to provide a first clock signal on a first clock node;
   a first delay circuit coupled to receive the first clock signal and configured to output a second clock signal on a second clock node, the second clock signal being a delayed complement of the first clock signal; and
   a latch configured to provide an output clock signal based on the first and second clock signals and a feedback signal received from a second delay circuit coupled to the latch, wherein a rising edge of the output clock signal is dependent on a rising edge of the input clock signal, and wherein a falling edge of the output clock signal is independent of a falling edge of the input clock signal.

2. The circuit as recited in claim 1, wherein the clock input circuit is coupled to receive the first clock signal from a first voltage domain having a first supply voltage, and wherein the latch is configured to provide the output clock signal into a second voltage domain having a second supply voltage different from the first.

3. The circuit as recited in claim 1, further comprising an enable circuit coupled to receive an enable signal, wherein the enable circuit is configured to inhibit the output clock signal when the enable signal is not active.

4. The circuit as recited in claim 1, further comprising a reset circuit configured to generate the falling edge of the output signal responsive to receiving the feedback signal from the second delay circuit.

5. The circuit as recited in claim 4, wherein the reset circuit is further configured to cause the output clock signal to be driven low responsive to assertion of a global reset signal.

6. The circuit as recited in claim 1, further comprising:
   a first pull-down circuit including a plurality of transistors having a first threshold voltage;
   a second pull-down circuit including a transistor having a second threshold voltage different than the first; and
   a pull-up circuit including a plurality of transistors having the second threshold voltage.

7. The circuit as recited in claim 1, further comprising:
   first and second pull-down circuits each configured to, when active, pull a third clock node low;
   a pull-up circuit configured to pull the third clock node high; and
   an inverter configured to drive the output clock signal high responsive to the third clock node being low and to drive the output clock signal low responsive to the third clock node being high.

8. The circuit as recited in claim 7, wherein the first pull-down circuit is configured to pull the third clock node low if the first clock signal and the second clock signal are high concurrent with assertion of an enable signal received by an enable circuit coupled to the latch, and wherein the pull-up circuit is configured to pull the third clock node high when the first clock signal or the second clock signal are low, or the enable signal is not asserted.

9. A method comprising:
   providing an input clock signal to a clock input circuit and to an input of a first delay circuit;
   generating, on a first clock node, a first clock signal responsive to the input clock signal;
   generating a second clock signal on a second clock node from an output of the delay circuit, wherein the second clock signal is a delayed complement of the first clock signal;
   providing, using a latch, an output clock signal based on the first clock signal, the second clock signal, and a feedback signal received from a second delay circuit coupled to receive the output clock signal, wherein a rising edge of the output clock signal is dependent on the input clock signal, and wherein a falling edge of the output clock signal is independent of a falling edge of the input clock signal.

10. The method as recited in claim 9, further comprising:
    providing the input clock signal from a first voltage domain operating according to a first supply voltage; and
    providing the output clock signal in a second voltage domain operating according to a second supply voltage different from the first supply voltage.

11. The method as recited in claim 9, further comprising:
    providing an enable signal to an enable circuit coupled to the latch;
    providing the output clock signal concurrent with assertion of the enable signal; and
    inhibiting the output clock signal responsive to de-assertion of the enable signal.

12. The method as recited in claim 9, further comprising:
providing the output clock signal to a second delay circuit;
providing the feedback signal in an asserted state from the second delay circuit to a reset circuit; and
generating the falling edge of the output clock signal responsive to receiving the feedback signal in the asserted state.

13. The method as recited in claim 9, further comprising:
providing a global reset signal to a reset circuit; and
driving the output clock signal low responsive to the reset circuit receiving the global reset signal.

14. An integrated circuit comprising:
first and second functional circuit blocks in communication with one another, wherein the first functional block is in a first voltage domain and the second functional circuit block is in a second voltage domain;
a clock generation circuit configured to receive an input clock signal generated in the first voltage domain and coupled to provide an output clock signal to the second functional circuit block, wherein the clock generation circuit includes:
  an clock input circuit configured to receive the input clock signal, wherein the clock input circuit is configured to provide a first clock signal on a first clock node;
  a first delay circuit coupled to receive the first clock signal and configured to output a second clock signal on a second clock node, the second clock signal being a delayed complement of the first clock signal; and
  a latch configured to provide the output clock signal based the first and second clock signals and a feedback signal received from a second delay circuit coupled to receive the output clock signal, wherein a rising edge of the output clock signal is dependent on a rising edge of the input clock signal, and wherein a falling edge of the output clock signal is independent of a falling edge of the input clock signal.

15. The integrated circuit as recited in claim 14, wherein circuitry in the first voltage domain is configured to operate on a first supply voltage and wherein circuitry in the second voltage domain is configured to operate on a second supply voltage different from the first supply voltage, and wherein the clock generation circuit is configured to provide the output clock signal into the second voltage domain.

16. The integrated circuit as recited in claim 14, wherein the clock generation circuit includes an enable circuit coupled to receive an enable signal, wherein the enable circuit is configured to inhibit the output clock signal when the enable signal is not active.

17. The integrated circuit as recited in claim 14, wherein the clock generation circuit includes a reset circuit configured to generate the falling edge of the output signal responsive to receiving the feedback signal from the second delay circuit, wherein the second delay circuit includes the second functional unit.

18. The integrated circuit as recited in claim 17, wherein the reset circuit is configured to drive the output clock signal low responsive to receiving a global reset signal.

19. The integrated circuit as recited in claim 14, wherein the latch includes:
a first pull-down circuit including a first plurality of transistors configured to switch at first threshold voltage;
a second pull-down circuit including a transistor configured to switch a second threshold voltage different than the first; and
a pull-up circuit including a second plurality of transistors configured to switch at second threshold voltage.

20. The integrated circuit as recited in claim 19, wherein:
wherein the first plurality of transistor are coupled in series, and wherein the first pull-down circuit is configured to pull a third clock node low when each of the plurality of transistors is active;
wherein the second plurality of transistors are coupled in parallel, and wherein the pull up circuit is configured to pull the third clock node high if any one of the second plurality of transistors is active.

* * * * *